(12) United States Patent
Hovakimyan (10) Patent No.: US 10,340,933 B1
(45) Date of Patent: Jul. 2, 2019

(54) TIME INTERLEAVED DIGITAL-TO-ANALOG CONVERTER CORRECTION

(71) Applicant: Tektronix, Inc., Beaverton, OR (US)

(72) Inventor: Karen Hovakimyan, San Jose, CA (US)

(73) Assignee: Tektonix, Inc., Beverton, OR (US)

(*) Notice: Subject to any disclaimer, the term of this patent is extended or adjusted under 35 U.S.C. 154(b) by 0 days.

(21) Appl. No.: 16/042,258

(22) Filed: Jul. 23, 2018

(51) Int. Cl.
*H03M 1/10* (2006.01)
*H03H 17/06* (2006.01)

(52) U.S. Cl.
CPC .......... *H03M 1/1009* (2013.01); *H03H 17/06* (2013.01)

(58) Field of Classification Search
CPC .. H03M 1/1009; H03M 1/0612; H03M 1/662; H03H 17/06
USPC .................................. 341/118, 120, 144, 155
See application file for complete search history.

(56) References Cited

U.S. PATENT DOCUMENTS

| 8,410,843 | B2* | 4/2013 | Goodman | H03M 1/1052 327/551 |
| 9,007,250 | B1* | 4/2015 | Jeraj | H03M 1/662 341/144 |

* cited by examiner

*Primary Examiner* — Khai M Nguyen
(74) *Attorney, Agent, or Firm* — Miller Nash Graham & Dunn; Andrew J. Harrington (57) ABSTRACT

A time interleaved digital to analog converters (TIDACs) system having a pre-processing filter to filter a digital signal prior to being converted by a respective digital-to-analog converter (DAC) of the TIDACs system to correct for mismatches between the DACs of the TIDACs system. Calibrating the pre-processing includes converting a discrete waveform at a first DAC to a first analog signals and at a second DAC to a second analog signal and combining the first and second analog signals into a combined signal. An analog-to-digital converter (ADC) converts the combined signal to a digital signal to determine an actual frequency response of the TIDACs system. A desired frequency response of the TIDACs system is received and a pre-processing filter is generated for the first DAC and the second DAC based on the actual frequency response of the TIDACs system and the desired frequency response of the TIDACs system.

20 Claims, 7 Drawing Sheets

TIME INTERLEAVED DIGITAL-TO-ANALOG CONVERTER CORRECTION

FIELD OF THE INVENTION

This disclosure is directed to systems and methods related to time interleaved digital-to-analog converters (DACs), and in particular, to calibrating a pre-processing digital signal processing (DSP) filter for a time interleaved DAC (TIDAC).

BACKGROUND

DACs are used to convert a digital signal to an analog signal. The bandwidth of a DAC, however, can be limited by either the analog bandwidth or the sample rate of the DAC. To achieve an effective higher DAC sample rate, a TIDAC system may be used in place of a single DAC, the TIDAC system including a number of time interleave DAC channels. Each DAC channel receives the input signal and outputs an analog signal that is offset in time within a single DAC sampling period. These analog signals can then be added together to effectively multiply the sampling rate of the overall DAC system.

However, in a TIDAC system, there can be frequency dependent magnitude and phase mismatches between the various channels of the TIDAC system, resulting in an analog output signal that may not be accurate.

Embodiments of the disclosure address these and other deficiencies of the prior art.

BRIEF DESCRIPTION OF THE DRAWINGS

Aspects, features, and advantages of embodiments of the present disclosure will become apparent from the following description of embodiments in reference to the appended drawings in which.

DESCRIPTION

Disclosed herein is a time interleaved digital-to-analog converter (DAC) system having a plurality of time interleaved DACs configured to convert a filtered digital signal to an analog signal and a plurality of pre-processing filters, each pre-processing filter associated with a respective one of the plurality of time interleaved DACs. Each pre-processing filter is configured to receive a digital signal and output the filtered digital signal. The pre-processing filters are calibrated to reduce any mismatch between the plurality of time interleaved DACs. The time interleaved DAC system also includes a combiner configured to combine each of the analog signals output by each of the DACs and output a combined analog signal.

Also disclosed herein is a calibration operation for calibrating each of the pre-processing filters to correct for any mismatch or distortion between the time interleaved DACs. The pre-processing filters are calibrated based on a desired DAC frequency response as well as an actual DAC frequency response. Based on these frequency responses, the pre-processing filter can be determined to correct for the mismatch between the time interleaved DACs, as will be discussed in more detail below.

Figure 1:
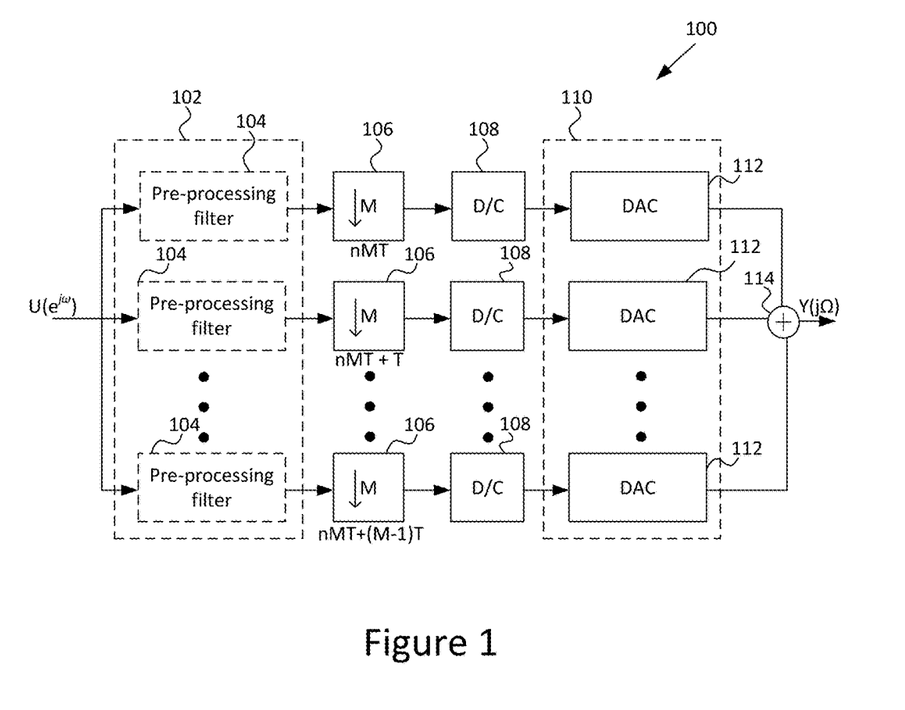
FIG. 1 illustrates a block diagram of a time interleaved digital-to-analog converter system according to embodiments of the disclosure.

FIG. 1 illustrates a block diagram of a time-interleaved DAC (TIDAC) system 100 with a digital signal processor (DSP) correction according to embodiments of the disclosure. The TIDAC system 100 may include a DSP 102, which may further include a plurality of Pre-processing filters 104, which may also be referred to herein as correction filters or pre-processing correction filters, as well as a number of down-samplers 106, discrete to continuous time domain converters 108, and TIDAC 110, which includes a plurality of time interleaved DACs 112. In some embodiments, the pre-processing filters 104 may be, for example, a finite impulse response (FIR) filter. In the illustration of FIG. 1, there are M parallel DACs 110 with indexes m=0, 1, ..., M−1. As such, the m-th DAC 110 receives its input data at time instance nMT+mT. The digital signal is pre-corrected by each of the pre-processing filters 104. Correction may be needed since DAC channels may introduce linear distortions and mismatches.

As seen in FIG. 1, a digital signal $U(e^{j\omega})$ is received at each of the pre-processing filters 104 in the DSP 102. The pre-processing filters 104 are calibrated, as will be discussed in more detail below, to pre-process and filter the digital signal to correct for any mismatch or linear distortions between the TIDACs 110. The outputs from the pre-processing filters 104 are each down sampled by a factor of M at each of the down samplers 106, with each of the down samplers 106 phase shifted from each other.

Discrete to continuous time domain converters 108 receive respective down sampled data from each of the down samplers 106 and convert the down sampled data to a continuous time domain. The DACs 112 process the signal to determine the analog frequency response. The analog frequency responses from all of the DACs 112 are then combined together through combiner 114 and output as the analog signal $Y(j\Omega)$. The combiner 114 may be an adder, as shown in FIG. 1, or any other component that combines the signal into a single output analog signal $Y(j\Omega)$.

Although a DSP 102 with pre-processing filters 104 is illustrated and discussed above, embodiments of the disclosure are not limited to a DSP 102, and as will be understood by one skilled in the art, any processing component and pre-processing filters 104 that correct the mismatch between the DACs 112, as discussed in more detail below, may be utilized in the TIDAC system 100.

Figure 2:
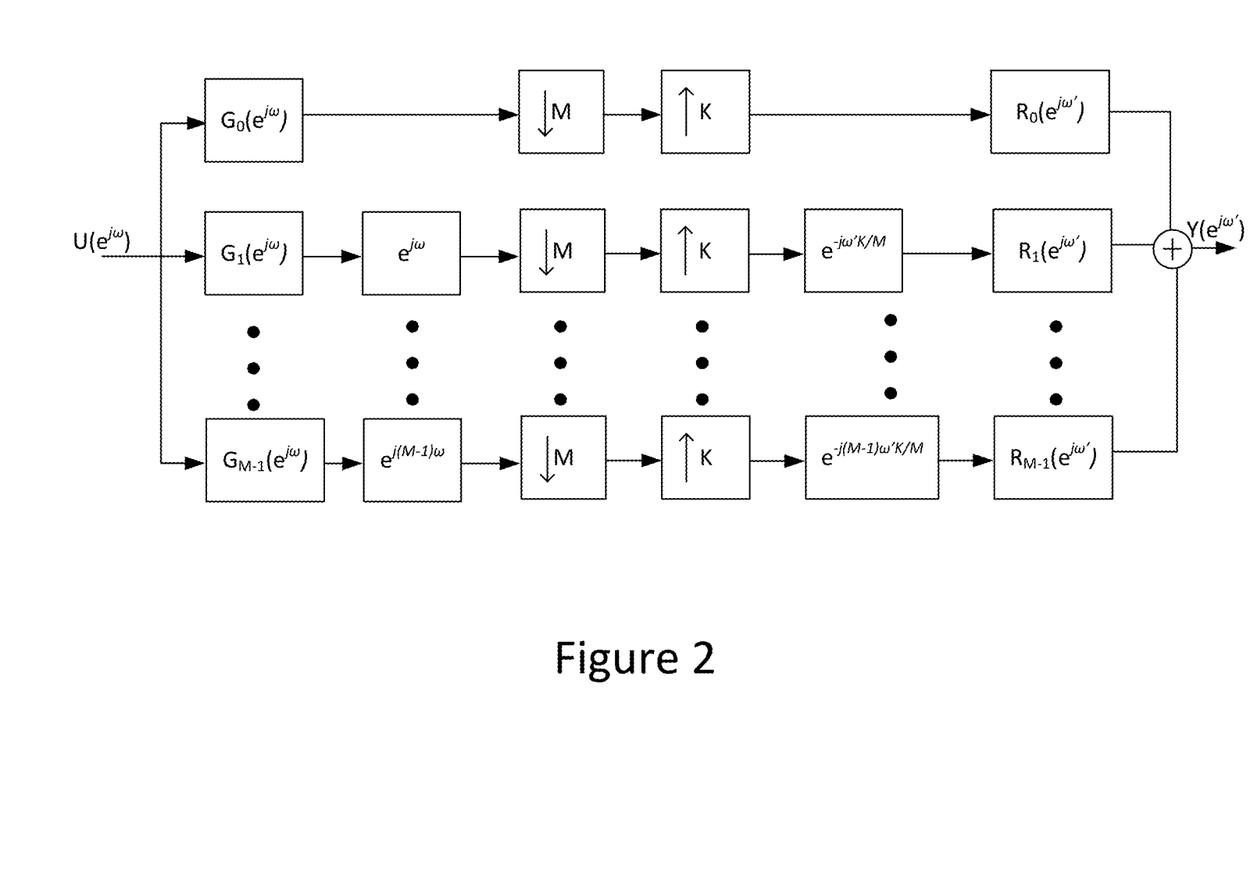
FIG. 2 illustrates a multirate filter bank representation of the time interleaved digital-to-analog converter system of FIG. 1.

To help the discussion of determining the pre-processing filters 104, the TIDAC system 100 can be modeled as a discrete time model of the TIDAC system 100 as shown in FIG. 2. Assuming that the output analog signal $Y(j\Omega)$ occupies the bandwidth ½ times higher than the TIDAC input rate $F_D$, the analog signals at the output of each DAC 112 can be represented by discrete time signals of a rate of $F_D$1, or, equivalently, $F_D$K/M. This takes into consideration the 1 Nyquists zones of each DAC 112. The resulting multirate filter bank is shown in FIG. 2, which is a maximally decimated filter bank, with the up-sampling factor K not necessarily equal to the down-sampling factor M.

Figure 3:
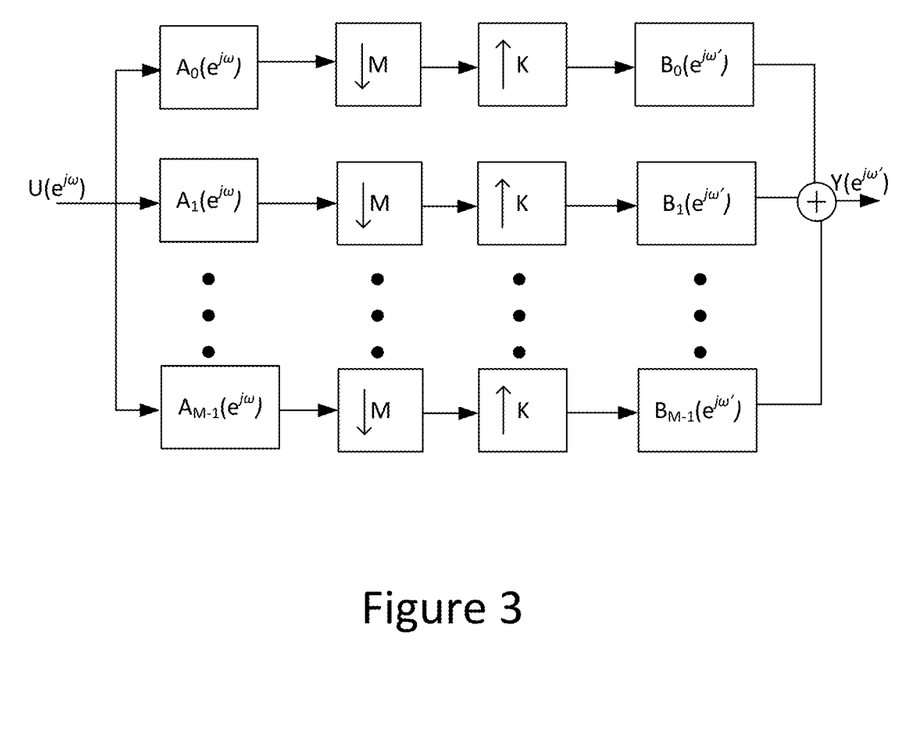
FIG. 3 illustrates a generalized multirate filter bank representation of the time interleaved digital-to-analog converter system of FIG. 1.

FIG. 3 illustrates a more generalized multirate filter bank with down-sampling factor M and up-sampling factor K. However, even though frequency domain notations $U(e^{j\omega})$ and $Y(e^{j\omega})$ are used to represent the input and output signals in FIGS. 2 and 3, there is no one-dimensional transfer function relationship between the input and output signals. In other words, there is no $H(e^{j\omega})$, such that:

$$Y(e^{j\omega}) = H(e^{j\omega}) U(e^{j\omega}) \quad (1)$$

This is because the TIDAC system of FIG. 1 is a linear periodic time varying (LPTV) system, rather than a linear time invariant (LTI) system that can be characterized by expression (1). To analyze an LPTV system, an alias component (AC) matrix method may be used. An AC matrix may be thought of as a generalization of the frequency response function of an LTI system. While in an LTI system, the frequency response function $H(e^{j\omega})$ describes the system output to the single input exponential at frequency ω, the AC matrix for an M-periodic LPTV system describes the input/output relationship of M exponentials, constituting an invariant subspace, e.g., an eigen-space.

Figure 4:
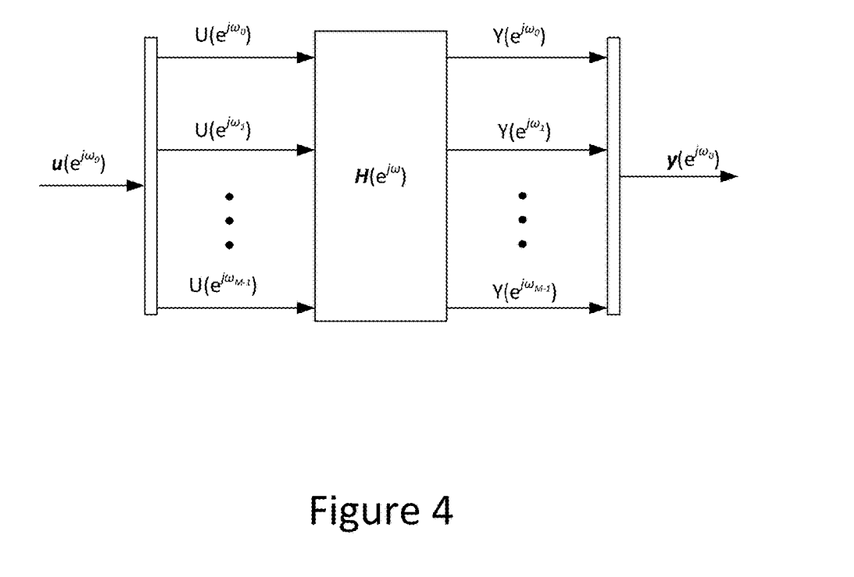
FIG. 4 illustrates a representation of a linear periodic time varying system using AC matrixes.

Specifically, if the input signal of the LPTV system, $U(e^{j\omega})$, consists of weighted sum of M exponentials $$e^{j\tilde{\omega}}, e^{j(\tilde{\omega} + \frac{2\pi}{M})}, \ldots, e^{j(\tilde{\omega} + \frac{2\pi(M-1)}{M})},$$

the output signal will also consist of the same exponentials with amplitudes formed by linear combinations of their input exponentials. This relationship is illustrated in FIG. 4, and can be expressed in vector form using an M by M AC matrix $H(e^{j\omega})$, such that:

$$y(e^{j\omega_0}) = H(e^{j\omega_0}) u(e^{j\omega_0}) \quad (2)$$

where M by one input and output vectors u and y are specified for frequencies:

$$\omega_p = \omega_0 + p(2\pi/M), p=0,1,\ldots,M-1 \quad (3)$$

with $$0 \leq \omega_0 < 2\pi/M \quad (4)$$

as $$u(e^{j\omega_0}) = [U(e^{j\omega_0}), U(e^{j\omega_1}), \ldots, U(e^{j\omega_{M-1}})]^T \quad (5)$$

$$y(e^{j\omega_0}) = [Y(e^{j\omega_0}), Y(e^{j\omega_1}), Y(e^{j\omega_{M-1}})]^T \quad (6)$$

As can be seen from expressions (2)-(6), the (k,p)-th component of the AC matrix $H(e^{j\omega_0})$ is a discrete time Fourier transform (DTFT) of the LPTV system output at frequency $\omega_k$ when unit amplitude complex exponential with frequency $\omega_p$ is applied at the LPTV system input.

While the AC matrix above has been discussed for a square, M×M, matrix, the AC matrix can be generalized to a rectangular matrix, K×M, suitable for the TIDAC models shown in FIGS. 2 and 3. With this generalization, the input vector $u(e^{j\omega_0})$ has dimension M, while the output vector $y(e^{j\omega'_0})$ has dimension K, and the normalized frequency ω' of the output signal is related to the normalized frequency ω of the input signal, by $$\omega'_0 = \omega_0 M/K \quad (7)$$

and $$\omega'_k = \omega'_0 + k(2\pi/K), k=0,1,\ldots,K-1 \quad (8)$$

since an output signal is sampled by K/M higher rate than an input signal. Relations between the normalized frequencies in radians, w, to frequencies in Hz, f are:

$$f'_k = (F_D K/M)(\omega'_k/2\pi), k=0,1,\ldots,K-1 \quad (9)$$

$$f_p = F_p \omega_p / 2\pi, p=0,1,\ldots,M-1 \quad (10)$$

Then, the input/output relation in the frequency domain is given by:

$$y(e^{j\omega_0}) = H(e^{j\omega'_0}, e^{j\omega_0}) u(e^{j\omega_0}) \quad (11)$$

where $u(e^{j\omega_0})$ and $\omega_p$ are specified in expressions (3)-(5) and:

$$y(e^{j\omega'_0}) = [Y(e^{j\omega'_0}), Y(e^{j\omega'_1}), \ldots, Y(e^{j\omega'_{K-1}})]^T \quad (12)$$

That is, the AC matrix of the multirate filter bank of FIG. 3 can be shown as:

$$H(e^{j\omega'_0}, e^{j\omega_0}) = B(e^{j\omega'_0}) A(e^{j\omega_0}) \quad (13)$$

with entries of matrixes $B(e^{j\omega'_0})$ and $A(e^{j\omega_0})$ given by:

$$B_{k,m}(e^{j\omega'_0}) = B_m(e^{j\omega'_0}), m=0,1,\ldots,M-1; k=0,1,\ldots K-1 \quad (14)$$

$$A_{m,p}(e^{j\omega_0}) = A_m(e^{j\omega_p}), m=0,1,\ldots,M-1; p=0,1,\ldots M-1 \quad (15)$$

In the case of real sine waves at the system input and output, instead of complex exponentials, the LPTV system representation given by expression (11) above is still valid, but expressions (3), (4), (5), and (12), respectively, are replaced as follows:

$$\omega_p = \begin{cases} \omega_0 + p(\pi/M), & \text{if } p = 0, 2, \ldots, M-2 \\ -\omega_0 + (p+1)(\pi/M), & \text{if } p = 1, 3, \ldots, M-1 \end{cases} \quad (16)$$

$$0 \leq \omega_0 < \pi/M \quad (17)$$

$$\omega'_k = \begin{cases} \omega'_0 + k(\pi/K), & \text{if } k = 0, 2, \ldots, K-2 \\ -\omega'_0 + (k+1)\pi/K, & \text{if } k = 1, 3, \ldots, K-1 \end{cases} \quad (18)$$

$$0 \leq \omega'_0 < \pi/K \quad (19)$$

and $$u_p(e^{j\omega_0}) = \begin{cases} U(e^{j\omega_p}), & \text{if } p = 0, 2, \ldots, M-2 \\ U^*(e^{j\omega_p}), & \text{if } p = 1, 3, \ldots, M-1 \end{cases} \quad (20)$$

$$y_k(e^{j\omega'_0}) = \begin{cases} Y(e^{j\omega'_k}), & \text{if } k = 0, 2, \ldots, K-2 \\ Y^*(e^{j\omega'_k}), & \text{if } k = 1, 3, \ldots, K-1 \end{cases} \quad (21)$$

The (k,p)-th component of the AC matrix $H(e^{j\omega'_0}, e^{j\omega_0})$ is a DTFT of the LPTV system output at frequency $\omega_k'$ (if K is even) when unit amplitude sinewave at $\omega_p$ is applied at the LPTV system input, or it is a complex conjugate of the DTFT measurement (if K is odd). To justify this, the real sinewave with frequency ω is the sum of two complex exponentials at opposite frequencies (ω and −ω) and a spectrum of a real signal is complex-conjugate symmetric. The group of frequencies given by expressions (16)-(19) will be called the group of related frequencies with $\omega_0$ being the initial (representative) frequency in the group.

Figure 5:
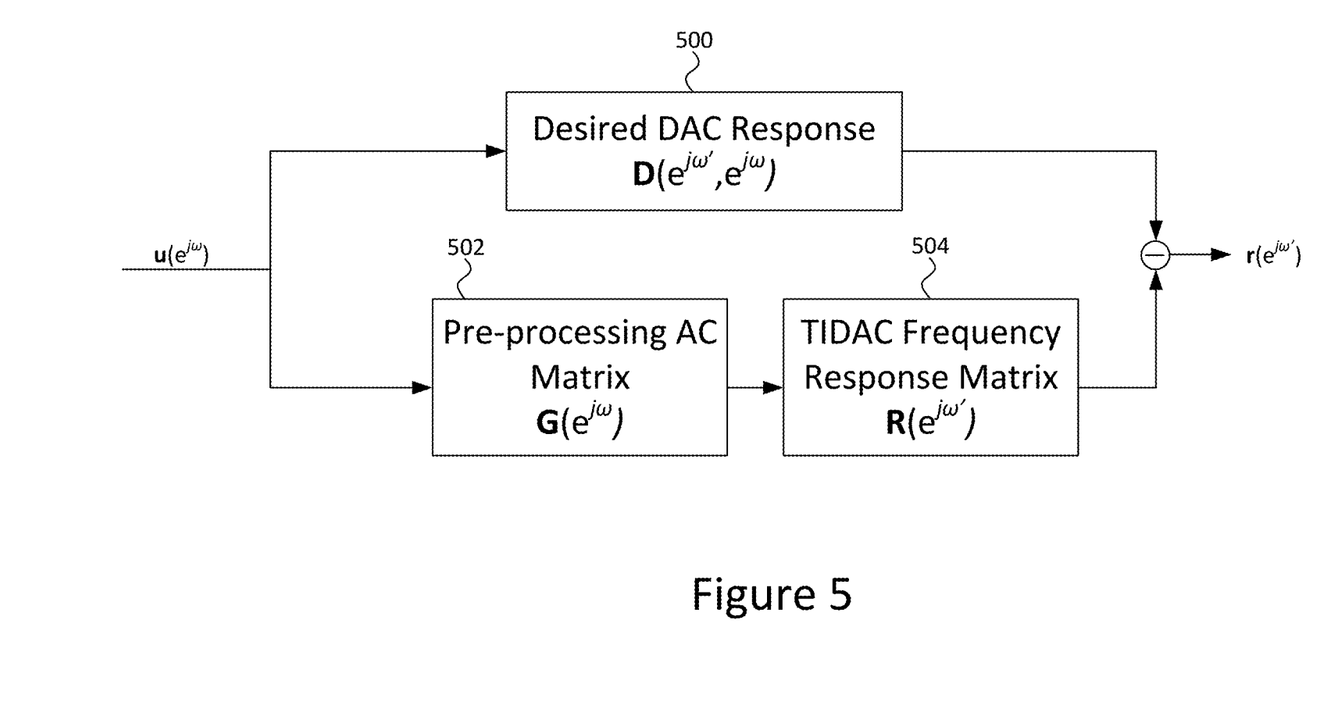
FIG. 5 illustrates a block diagram illustrating a calibration operation according to embodiments of the disclosure.

Embodiments of the disclosure calibrate the pre-processing filters 104 so that the LPTV system of FIGS. 2 and 3 approximate a desired LTI system. This can be accomplished by calibrating the pre-processing filters 104 to compensate for alias distortion components in the output of the TIDAC system 100. FIG. 5 shows an example of a block diagram for illustrating how the pre-processing filters 104 are designed to compensate for alias distortion components in the output of the TIDAC system 100. Block 500 represents a desired DAC system, $D(e^{j\omega'}, e^{j\omega})$, and output $r(e^{j\omega'})$ represents a resulting approximation error.

As was shown in expression (13), the LPTV system consisting of TIDACs 112 with correction, such as an AC matrix, can be factored into two systems: the LPTV pre-processing system represented by block 502 and AC matrix $G(e^{j\omega})$ and the TIDAC system 100 with the pre-processing represented by block 504 and the AC matrix $R(e^{j\omega'})$. These are located on the lower branch of FIG. 5. The goal of calibrating the pre-processing filters 104 is to have the resulting approximation error, $r(e^{j\omega'})$, which is the difference between the upper branch of block 500 and the lower branch of blocks 502 and 504, be as close to zero as possible.

In the diagram shown in FIG. 5, the desired frequency response matrix $D(e^{j\omega'}, e^{j\omega})$ may be specified, such as by a user, and the TIDAC frequency response may be measured, without the pre-processing filters 104, to generate the AC matrix $R(e^{j\omega'})$, resulting in both blocks 500 and 504 being known. As will be described in more detail below, the pre-processing AC matrix $G(e^{j\omega})$ can be determined based on the two AC matrixes $D(e^{j\omega'}, e^{j\omega})$ and $R(e^{j\omega'})$ such that the resulting approximation error $r(e^{j\omega'})$ is minimized under some normalization, and then the pre-processing filters 104 can be generated based on the determined pre-processing AC matrix $G(e^{j\omega})$.

Figure 6:
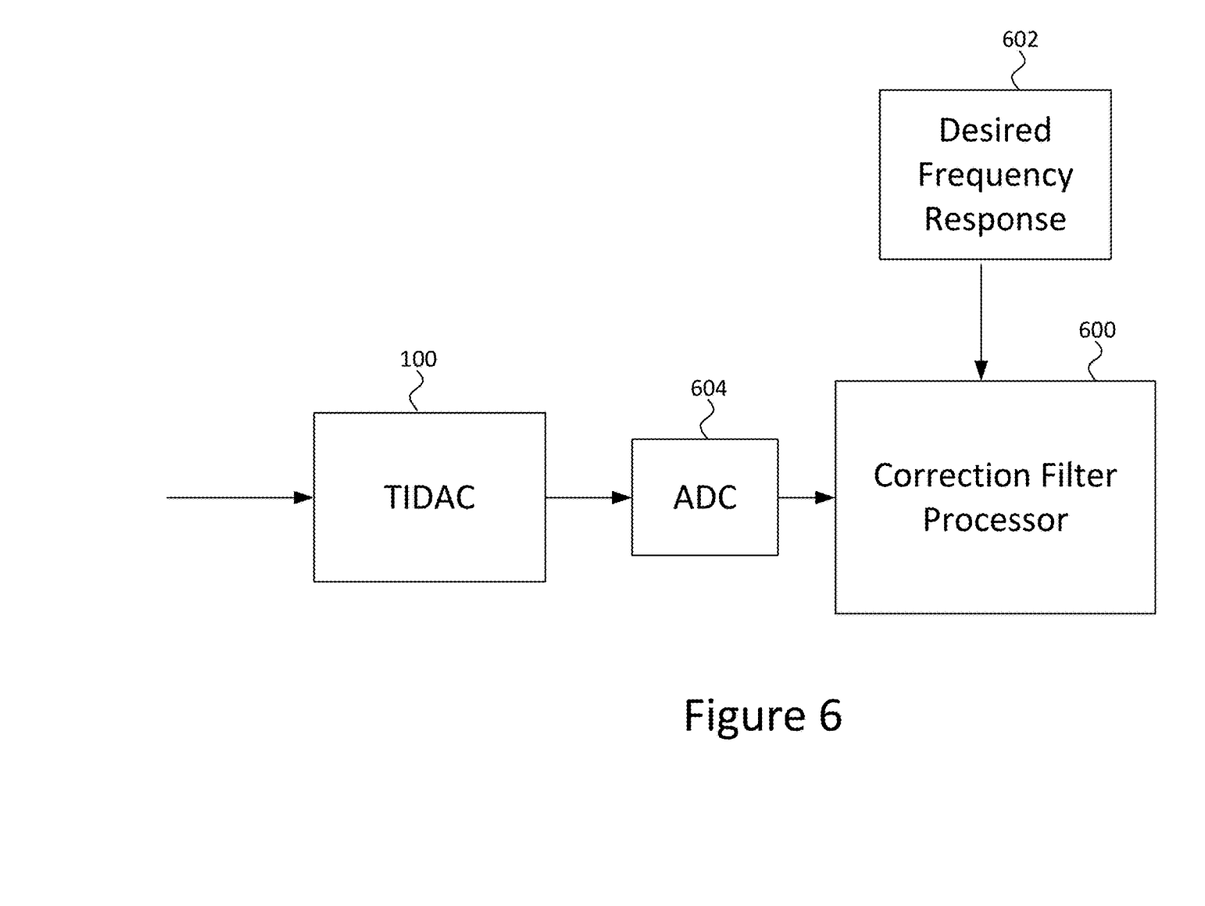
FIG. 6 illustrates an example calibration system according to some embodiments of the disclosure.

FIG. 6 is a block diagram illustrating the various components used to calibrate and/or determine the pre-processing filters 104. In the example of FIG. 6, a correction filter processor 600 is provided to determine the pre-processing filters 104 based on the desired frequency response 602, as well as an output of the TIDAC system 100 that has been converted to a digital signal by an analog-to-digital converter (ADC) 604.

Starting with the upper branch of FIG. 5, the desired DAC frequency response should have no mismatches and posses a desired LTI frequency response, which is designated as $D_0$ $(e^{j\omega_k})$. In some embodiments, the desired LTI frequency response may include pre-emphasis at some frequencies, while in other embodiments, one of the DACs 112, such as a DAC 112 described by the frequency response $R_0(e^{j\omega'})$ may be used as a prototype for a desired system, where $D_0$ $(e^{j\omega_k}) = R_0 (e^{j\omega_k})$.

Alternatively, in some embodiments, the frequency response of each of the TIDACs 110 $R_m(e^{j\omega'})$ can be averaged to determine the desired frequency response 602. Note, in this embodiment, the TIDACs 110 frequency responses $R_m(e^{j\omega'})$ can be computed by setting precoder frequency responses $G_m(e^{j\omega'})=1$ and using expressions (13)-(15) with A and B matrixes adjusted per FIG. 2. Assuming that a prototype DAC 112 response has been chosen and designated $D_0(e^{j\omega'})$, the desired AC matrix can be determined by the correction filter processor 600 by setting $R_m(e^{j\omega'})=D_0(e^{j\omega'})$ and $G_m(e^{j\omega'})=1$ for all m (m=0, 1, . . . , M−1) in FIG. 2. Then, it can be shown that such a system becomes an LTI system with AC matrix components:

$$D_{k,p}(e^{j\omega'_0}, e^{j\omega_0}) = \begin{cases} D_0(e^{j\omega'_k})e^{-j\omega_p d}, & \text{if } k = p + (l-1)M, l \text{ is odd} \\ D_0(e^{j\omega'_k})e^{-j\omega_p d}, & \text{if } k = -p + lM + 1, l \text{ is even} \\ 0, & \text{otherwise} \end{cases} \quad (22)$$

where factor $e^{-j\omega_p d}$ (or equivalently $e^{-j\omega'_k d}$) is introduced to budget for the possible delay in the pre-processing stage. In the situation of real signals, the even rows, if counted from 1, in the quasi-diagonal matrix shown in expression (22) may be replaced by their complex conjugate values.

Next, the TIDAC AC matrix $R(e^{j\omega'})$ may be measured. Using FIG. 2 as a reference, the filters $G_m(e^{j\omega})$ can be replaced with unity filters to obtain the TIDAC system 100 model without data pre-processing performed in DSP 102. If FIG. 3 is used as a reference, the analysis filters $A_m(e^{j\omega})$ reduce to the "advance in time elements" $e^{j\omega m}$.

To measure the AC matrix of the diagram of FIG. 3, multiple discrete time sinewave signals, with a sample rate of $F_D$, at M frequencies, as given by expressions (16) and (17) above, are sequentially applied. The discrete Fourier transform (DFT) is measured at each of the frequencies given by expressions (18) and (19) above. This is done by processing the analog output of the TIDAC system 100 with unity filters, as mentioned above, by ADC 604, with a sampling rate of $F_D K/M$.

The measured frequency response matrix (p, k)-th entry will be the DFT value measured at k-th frequency when the sinewave with p-th frequency was applied to each DAC 112. By varying the initial frequency point $\omega_0$ the measured frequency response matrixes (each of size M×K) can be determined for future processing. Designating one of the measured frequency matrixes by $B(e^{j\omega_0'}, e^{j\omega_0})$, the corresponding AC matrix $R(e^{j\omega_0'})$ can be determined from expression (13):

$$R(e^{j\omega_0'})=B(e^{j\omega_0'},e^{j\omega_0})E(e^{j\omega_0})^{-1} \quad (23)$$

where entries of matrix E are the above-discussed "advance in time elements" given by:

$$E_{m,p}(e^{j\omega_0})=e^{j\omega_p m}; m,p=0,1,\ldots,M-1 \quad (24)$$

That is, the correction filter processor 600 uses expressions (23) and (24) and the measured frequency matrixes $B(e^{j\omega_0'}, e^{j\omega_0})$ to determine the AC matrix $R(e^{j\omega_0'})$.

However, the full set of frequencies measured to determine the measured frequency matrix $B(e^{j\omega_0'}, e^{j\omega_0})$ may not be feasible for measurements of the TIDAC system 100. In such a case, the measured frequency matrix $B(e^{j\omega_0'}, e^{j\omega_0})$ will contain empty spots that can be interpolated based on the available measurements.

Figure 7:
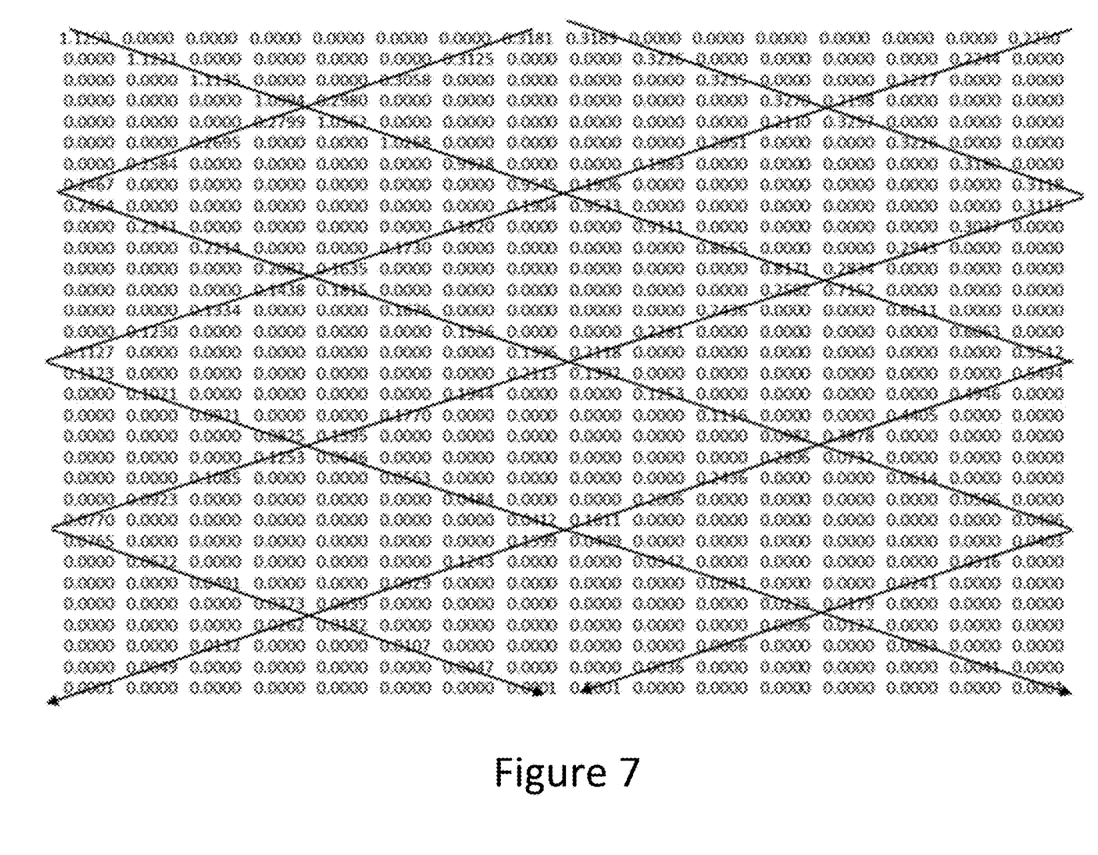
FIG. 7 illustrates an AC matrix of measured frequencies for a time interleaved digital-to-analog converter system of FIG. 1 without pre-processing filters.

FIG. 7 illustrates an example of the measured frequency matrix $B(e^{j\omega_0'}, e^{j\omega_0})$, where the system has four TIDACs 112, with absolute values of the full AC matrix. Interpolation should be performed along the sub-diagonals, folded, as indicated in FIG. 7.

That is, one of the four interpolations should be done along the diagonal starting at AC matrix element (1,1) and going to the right and down to element (8,8), then folding back and going left and down from element (9,8) to element (16,1). A similar interpolation procedure may be implemented on the other three diagonals shown in FIG. 7.

Since AC matrix $B(e^{j\omega_0'}, e^{j\omega_0})$ elements are complex, an interpolation, in frequency domain, needs to be performed for absolute values and for phase values. To avoid inaccuracies related to phase ambiguity, a linear trend may be removed in some embodiments from the phase measurements by dividing measured complex AC values by the exponential factor that considers the common delayed introduced by the DAC 112 and measuring ADC 604. This amount of delay may be known or estimated from the measurement under an assumption that it is possible to trigger ADC 112 capturing the waveforms, generated by the DAC 112, such that ADC 604 will capture the waveform always with the same delay relative to the DAC data. For example, the TIDAC 110 may be fed with sinewave data with phase zero data being fed to the first sub-DAC 112 and captured DAC 112 output with the ADC 604. The operation is then repeated with another sinewave frequency, again feeding the phase zero data to the first sub-DAC 112, and the ADC 604 output is captured with the same delay as in the first instance.

In an alternative embodiment, markers may be placed on the TIDAC 110 input data to track the delay. However, markers may sometimes disperse when being processed through digital-to-analog and then analog-to-digital conversions, making markers not as reliable as the above operation.

Once the required values of the AC matrix $B(e^{j\omega_0'}, e^{j\omega_0})$ have been interpolated, then the correction filter processor 600 uses expression (23) above to calculate the AC matrix $R(e^{j\omega'})$.

Once the desired frequency response matrix $D(e^{j\omega'}, e^{j\omega})$ and the TIDAC frequency response matrix $R(e^{j\omega'})$ have been identified, the AC matrix $\hat{G}$ corresponding to the digital pre-processing part of TIADC can be determined by the following expression:

$$\hat{G}(e^{j\omega_0}) = \arg\left(\left\|\min_{G(e^{j\omega_0})}\left[D(e^{j\omega_0'}, e^{j\omega_0}) - R(e^{j\omega_0'})G(e^{j\omega_0})\right]\right\|_2\right) \quad (25)$$

where the Euclidean norm, or in the case of matrixes also called the Frobenius norm, is used for minimization of approximation error. From expression (25), the expression (26) below follows.

TIDAC system 100 in FIG. 1 will match discrete time model presented in FIG. 2 if K=M, $R_m(e^{j\omega})=1$, and matrix T is defined in expression (27) below with entries corresponding to the precoder Frequency Responses $G_m(e^{j\omega_p})$.

$$\hat{G}(e^{j\omega_0}) = (R(e^{j\omega_0'}))^{-1}D(e^{j\omega_0'}, e^{j\omega_0}) \quad (26)$$

$$T_{m,p}(e^{j\omega_0}) = G_m(e^{j\omega_p})e^{j\omega_p m} \quad (27)$$

Then, using expression (13), this can be rewritten as:

$$\hat{G}(e^{j\omega_0}) = E^H(e^{j\omega_0})T(e^{j\omega_0}) \quad (28)$$

Matrix E is specified in expression (24), such that:

$$T(e^{j\omega_0}) = (E^H(e^{j\omega_0}))^{-1}\hat{G}(e^{j\omega_0}) = E\hat{G}(e^{j\omega_0}) \quad (29)$$

Then, from entries in $T_{m,p}(e^{j\omega_0})$, the frequency responses of the pre-processing filters 104 $G_m(e^{j\omega})$ can be found using expression (27), such that:

$$G_m(e^{j\omega_p}) = T_{m,p}(e^{j\omega_0})e^{-j\omega_p m}; m,p=0,1,\ldots,M-1 \quad (30)$$

The above expressions can be repeated for different frequency groups by the correction filter processor 600. Once all the required frequency groups have been determined, then the correction filter processor 600 can determine the DSP filter 104 which approximates these determined responses.

First, to distinguish different frequency groups, the notations $\omega_p^{(n)}$, $\omega_k'^{(n)}$ where n indicates frequency group number are introduced. Subscript indexes p,k as before, show the frequency index inside the group. Frequencies $\omega_p^{(n)}$, $\omega_k'^{(n)}$ are related to the group's initial frequencies $\omega_0^{(n)}$, $\omega_0'^{(n)}$ as specified in expressions (16)-(19).

Given the frequency responses $G_m(e^{j\omega})$, the correction filter processor 600 determines M pre-processing filters 104 with frequency responses approximating $G_m(e^{j\omega})$, m=0,1,..., M. If FIR filters are used, using designation $q_m$, m=0,1,..., M-1; for the m-th FIR filter with coefficients $g_m(s)$, s=0,1,... S-1 the m-th FIR filter response is:

$$Q_m(e^{j\omega_p^{(n)}}) = \sum_{s=0}^{S-1} q_m(s)e^{-j\omega_p^{(n)}s}; p=0,1,\ldots,M-1; \quad n=0,1,\ldots,N-1 \quad (31)$$

The m-th FIR coefficients can be found through a weighted least mean square (WLMS) operation, shown in expression (32):

$$\hat{q}_m = \arg\left\{\min_{q_m}\sum_{n=0}^{N-1}\sum_{p=0}^{M-1}w(n+pN)\left|\sum_{s=0}^{S-1}q_m(s)e^{-j\omega_p^{(n)}s} - G_m(e^{j\omega_p^{(n)}})\right|^2\right\} \quad (32)$$

To solve expression (32) to determine the FIR coefficients by the correction filter processor 600, the matrix notation F is introduced with entries $e^{-j\omega_p^{(n)}s}$, with s being the column index and n+pN being the row indexes of F, the column vector $g_m$, with entries $G_m(e^{j\omega_p^{(n)}})$ using same arrangement of indexes as row indexes of F, and the diagonal matrix W, with diagonal entries w(n+pN) being the weighting factors for the frequencies $\omega_p^{(n)}$. Then the WLMS solution is given by expression (33):

$$\hat{q}_m = (\text{real}[F^H W F])^{-1}\text{real}[F^H W g_m] \quad (33)$$

Using the expression (33), the correction filter processor 600 can determine the FIR filter coefficients for each of the DAC channels of the TIDAC system 100.

The expressions discussed above have been provided so far under the assumption that the ADC 604 used to capture the TIDAC system 100 output has a sampling rate equal to a multiple of the DAC sampling rate. However, in some embodiments, this may not be the situation. In such embodiments, the relationship of the ADC 604 sampling rate, $F_A$, and the TIDAC system 100 sampling rate, $F_D$, can be related as shown in expression (34), with $P_1$ and $P_2$ being some integers:

$$\frac{F_A}{F_D} = \frac{P_1}{P_2} \quad (34)$$

If ADC 604 Nyquist rate $F_A/2$ is higher than a DAC 112 bandwidth, then samples at multiple of DAC 112 output rates can be interpolated, using timing interpolation, rather than frequency interpolation discussed above. However, in some embodiments, interpolation may not be needed if DAC calibration frequencies are chosen by taking into account the ADC 604 sampling rate.

First, a DFT processing length for the ADC captured data, $N_A$, is chosen. Then, the processing length for the DAC captured data is specified:

$$N_D = N_A P_2/P_1 \quad (35)$$

The calibration frequencies in hertz (Hz) can be chosen as shown in expression (36), with integers n, calibration indexes, chosen such that calibration frequencies $f_{cal}(n)$ satisfy expressions (3) and (10), above:

$$f_{cal}(n) = \frac{nF_D}{N_D} = \frac{nF_A}{N_A} \quad (36)$$

This makes DAC calibration DFT bin $F_D/N_D$ equal to the ADC 604 DFT bin $F_A/N_A$ and allows the correction filter processor 600 to compute values of the DAC AC matrix $R(e^{j\omega'})$ based on the DFT values of the ADC 604 output.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a method for calibrating pre-processing filters for a time-interleaved digital-to-analog converters (TIDACs) system, comprising converting a discrete waveform at a first digital-to-analog converter (DAC) of the TIDACs system to a first analog signals; converting the discrete waveform at a second DAC to a second analog signal of the TIDACS system; combining the first analog signal and the second analog signal into a combined analog signal; converting via an analog-to-digital converter (ADC) the combined analog signal to a digital signal to determine an actual frequency response of the TIDACs system; receiving a desired frequency response of the TIDACs system; and generating a pre-processing filter for at least one of the first DAC and the second DAC based on the actual frequency response of the TIDACs system and the desired frequency response of the TIDACs system.

Example 2 is the method of example 1, wherein determining the pre-processing filter for at least one of the first DAC and the second DAC includes selecting filter coefficients for the pre-processing filter that reduce the difference between the desired frequency response and a frequency response of the DAC having an input pre-processed with the pre-processing filter.

Example 3 is the method of either example 1 or 2, wherein the pre-processing filter is a finite impulse response (FIR) filter.

Example 4 is the method of example 3, wherein determining the FIR filter includes determining FIR filter coefficients through a weighted least mean square operation.

Example 5 is the method of any one of examples 1-4, wherein the ADC sample rate is not an integer multiple of the sampling rates of the first DAC and the second DAC.

Example 6 is the method of example 5, further comprising determining the pre-processing filter for at least one of the first DAC and the second DAC based on the ADC sample rate.

Example 7 is the method of example 5, further comprising determining whether the combined analog signal is a valid frequency and when the combined analog signal is not a valid frequency, the actual frequency response is determined by interpolating samples of the respective ADC output based on the respective DAC sampling rate.

Example 8 is the method of any one of examples 1-7, wherein the actual frequency response is a first actual frequency response, the method further comprising generating a second actual frequency response of the TIDAC system by interpolating the second actual frequency response based on the actual frequency response, generating the pre-processing filter for the at least one of the first DAC and the second DAC includes generating the pre-processing filter based on the first actual frequency response of the TIDACs system, the second actual frequency response of the TIDACs system and the desired frequency response of the TIDACs system.

Example 9 is a time interleaved digital-to-analog converter (DAC) system, comprising a plurality of time interleaved DACs configured to convert a filtered digital signal to an analog signal; a plurality of pre-processing filters, each pre-processing filter associated with a respective one of the plurality of time interleaved DACs, and each pre-processing filter configured to receive a digital signal and output the filtered digital signal, the pre-processing filters determined based on measured mismatch between the plurality of time interleaved DACs; and a combiner configured to combine each of the analog signals output by each of the DACs and output a combined analog signal.

Example 10 is the time-interleaved DAC system of example 9, wherein each pre-processing filter is a finite impulse response filter.

Example 11 is the time-interleaved DAC system of either example 9 or 10, wherein the pre-processing filters are each configured to pre-process the digital signal to correct for a mismatch between the plurality of time interleaved DACs.

Example 12 is the time interleaved DAC system of any one of examples 1-11, wherein each pre-processing filter is determined based on an actual frequency response of a respective time interleaved DAC and a desired frequency response of the respective time interleaved DAC.

Example 13 is the time interleaved DAC system of example 12, wherein each pre-processing filter is determined by minimizing a difference between a desired frequency response of the respective time interleaved DAC and a product of the frequency response of the respective pre-processing filter and an actual frequency response of the respective time interleaved DAC.

Example 14 is the time interleaved DAC system of any one of examples 9-13, further comprising a respective down sampler configured to receive the filtered digital signal and down sample the filtered digital signal.

Example 15 is one or more computer readable storage media having instructions stored thereon that, when executed by a processor of a calibration system, cause the calibration system to convert a discrete waveform at a first digital-to-analog converter (DAC) of a time-interleaved digital-to-analog converters (TIDACs) system to a first analog signals; convert the discrete waveform at a second DAC to a second analog signal of the TIDACS system; combine the first analog signal and the second analog signal into a combined analog signal; convert via an analog-to-digital converter (ADC) the combined analog signal to a digital signal to determine an actual frequency response of the TIDACs system; receive a desired frequency response of the TIDACs system; and generate a pre-processing filter for at least one of the first DAC and the second DAC based on the actual frequency response of the TIDACs system and the desired frequency response of the TIDACs system.

Example 16 is one or more computer readable storage media of example 15, wherein the instructions further cause the calibration system to determine the pre-processing filter for at least one of the first DAC and the second DAC by selecting filter coefficients for the pre-processing filter that reduce the difference between the desired frequency response and a frequency response of the DAC having an input pre-processed with the pre-processing filter.

Example 17 is one or more computer readable storage media of either example 15 or 16, wherein the pre-processing filter is a finite impulse response (FIR) filter.

Example 18 one or more computer readable storage media of example 17, wherein the instructions further cause the calibration system to determine the FIR filter by determining FIR filter coefficients through a weighted least mean square operation.

Example 19 one or more computer readable storage media of any one of examples 1-18, wherein the ADC sample rate is not an integer multiple of the sampling rates of the first DAC and the second DAC.

Example 20 is one or more computer readable storage media of example 19, further comprising determining the pre-processing filter for at least one of the first DAC and the second DAC based on the ADC sample rate.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

What is claimed is:

1. A method for calibrating pre-processing filters for a time-interleaved digital-to-analog converters (TIDACs) system, comprising:
   converting a first discrete waveform at a first frequency at a first digital-to-analog converter (DAC) of the TIDACs system to a first analog signal and at a second DAC of the TIDACs system to a second analog signal;
   converting a second discrete waveform at a second frequency at the first DAC to a third analog signal and at the second DAC to a fourth analog signal;
   combining the first analog signal and the second analog signal into a first combined analog signal and combining the third analog signal and the fourth analog signal into a second combined signal;
   converting via an analog-to-digital converter (ADC) the first combined analog signal to a first digital signal and second combined analog signal to a second digital signal;
   determining an actual frequency response of the TIDACs system by transforming the first digital signal and the second digital signal to a respective frequency response signal by discrete Fourier transform and generating an actual frequency response matrix based on the respective frequency responses;
   receiving a desired frequency response matrix of the TIDACs system; and
   generating a pre-processing filter for at least one of the first DAC and the second DAC based on the actual frequency response matrix of the TIDACs system and the desired frequency response matrix of the TIDACs system.

2. The method of claim 1, wherein determining the pre-processing filter for at least one of the first DAC and the second DAC includes selecting filter coefficients for the pre-processing filter that reduce the difference between the desired frequency response matrix and a frequency response matrix of the DAC having an input pre-processed with the pre-processing filter.

3. The method of claim 1, wherein the pre-processing filter is a finite impulse response (FIR) filter.

4. The method of claim 3, wherein determining the FIR filter includes determining FIR filter coefficients through a weighted least mean square operation.

5. The method of claim 1, wherein the ADC sample rate is not an integer multiple of the sampling rates of the first DAC and the second DAC.

6. The method of claim 5, further comprising determining the pre-processing filter for at least one of the first DAC and the second DAC based on the ADC sample rate.

7. The method of claim 5, further comprising determining whether the combined analog signal is a valid frequency and when the combined analog signal is not a valid frequency, the actual frequency response matrix is determined by interpolating samples of the respective ADC output based on the respective DAC sampling rate.

8. The method of claim 1, wherein the actual frequency response matrix is a first actual frequency response matrix, the method further comprising:
generating a second actual frequency response matrix of the TIDAC system by interpolating the second actual frequency response matrix based on the first actual frequency response matrix, generating the pre-processing filter for the at least one of the first DAC and the second DAC includes generating the pre-processing filter based on the first actual frequency response matrix of the TIDACs system, the second actual frequency response matrix of the TIDACs system and the desired frequency response matrix of the TIDACs system.

9. A time interleaved digital-to-analog converter (DAC) system, comprising:
a plurality of time interleaved DACs configured to convert a digital signal to an analog signal;
a plurality of pre-processing filters, each pre-processing filter associated with a respective one of the plurality of time interleaved DACs, and each pre-processing filter configured to receive a digital signal and output the filtered digital signal, the pre-processing filters determined based on measured mismatch between the plurality of time interleaved DACs;
a combiner configured to combine each of the analog signals output by each of the DACs and output a combined analog signal; and
a pre-processing filter processor configured to:
convert a first discrete waveform at a first frequency at a first DAC of the time interleaved DACs to a first analog signal and at a second DAC the time interleaved DACs to a second analog signal;
convert a second discrete waveform at a second frequency at the first DAC to a third analog signal and at the second DAC to a fourth analog signal;
combine the first analog signal and the second analog signal into a first combined analog signal and combining the third analog signal and the fourth analog signal into a second combined signal;
convert via an analog-to-digital converter (ADC) the first combined analog signal to a first digital signal and second combined analog signal to a second digital signal;
determine an actual frequency response of the TIDACs system by transforming the first digital signal and the second digital signal to a respective frequency response signal by discrete Fourier transform and generating an actual frequency response matrix based on the respective frequency responses; and
generate a pre-processing filter for at least one of the first DAC and the second DAC based on the actual frequency response matrix of the TIDACs system and a desired frequency response matrix of the TIDACs system.

10. The time-interleaved DAC system of claim 9, wherein each pre-processing filter is a finite impulse response filter.

11. The time-interleaved DAC system of claim 9, wherein the pre-processing filters are each configured to pre-process the digital signal to correct for a mismatch between the plurality of time interleaved DACs.

12. The time interleaved DAC system of claim 9, wherein each pre-processing filter is determined based on an actual frequency response of a respective time interleaved DAC and a desired frequency response of the respective time interleaved DAC.

13. The time interleaved DAC system of claim 12, wherein each pre-processing filter is determined by minimizing a difference between a desired frequency response of the respective time interleaved DAC and a product of the frequency response of the respective pre-processing filter and an actual frequency response of the respective time interleaved DAC.

14. The time interleaved DAC system of claim 9, further comprising a respective down sampler configured to receive the filtered digital signal and down sample the filtered digital signal.

15. One or more computer readable storage media having instructions stored thereon that, when executed by a processor of a calibration system, cause the calibration system to:
convert a first discrete waveform at a first frequency at a first digital-to-analog converter (DAC) of the TIDACs system to a first analog signal and at a second DAC of the TIDACs system to a second analog signal;
converting a second discrete waveform at a second frequency at the first DAC to a third analog signal and at the second DAC to a fourth analog signal;
combine the first analog signal and the second analog signal into a first combined analog signal and combine the third analog signal and the fourth analog signal into a second combined signal;
convert via an analog-to-digital converter (ADC) the first combined analog signal to a first digital signal and second combined analog signal to a second digital signal;
receive a desired frequency response matrix of the TIDACs system; and
generate a pre-processing filter for at least one of the first DAC and the second DAC based on the actual frequency response matrix of the TIDACs system and the desired frequency response matrix of the TIDACs system.

16. The one or more computer readable storage media of claim 15, wherein the instructions further cause the calibration system to determine the pre-processing filter for at least one of the first DAC and the second DAC by selecting filter coefficients for the pre-processing filter that reduce the difference between the desired frequency response and a frequency response of the DAC having an input pre-processed with the pre-processing filter.

17. The one or more computer readable storage media of claim 15, wherein the pre-processing filter is a finite impulse response (FIR) filter.

18. The one or more computer readable storage media of claim 17, wherein the instructions further cause the calibration system to determine the FIR filter by determining FIR filter coefficients through a weighted least mean square operation.

19. The one or more computer readable storage media of claim 15, wherein the ADC sample rate is not an integer multiple of the sampling rates of the first DAC and the second DAC.

20. The one or more computer readable storage media of claim 19, further comprising determining the pre-processing filter for at least one of the first DAC and the second DAC based on the ADC sample rate.

* * * * *